(12) United States Patent
Jang et al.

(10) Patent No.: US 10,903,003 B2
(45) Date of Patent: Jan. 26, 2021

(54) CAPACITOR COMPONENT

(71) Applicant: SAMSUNG ELECTRO-MECHANICS CO., LTD., Suwon-si (KR)

(72) Inventors: Chang Soo Jang, Suwon-si (KR); Ho Phil Jung, Suwon-si (KR); Seung Mo Lim, Suwon-si (KR); Tae Joon Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 1 day.

(21) Appl. No.: 16/104,570

(22) Filed: Aug. 17, 2018

(65) Prior Publication Data

US 2019/0237251 A1 Aug. 1, 2019

(30) Foreign Application Priority Data

Jan. 31, 2018 (KR) .................... 10-2018-0012040

(51) Int. Cl.
 *H01G 4/005* (2006.01)
 *H01G 4/008* (2006.01)
 (Continued)

(52) U.S. Cl.
 CPC .............. *H01G 4/01* (2013.01); *H01G 4/005* (2013.01); *H01G 4/008* (2013.01);
 (Continued)

(58) Field of Classification Search
 CPC ........... H01G 4/01; H01G 4/012; H01G 4/30; H01G 4/005; H01G 4/008; H01G 4/1209; H01G 4/252; H01G 4/33
 (Continued)

(56) References Cited

U.S. PATENT DOCUMENTS

2007/0145599 A1 6/2007 Kim
2008/0291603 A1\* 11/2008 Matters-Kammerer ..................... H01L 28/90
361/313

(Continued)

FOREIGN PATENT DOCUMENTS

JP 2009-246180 A 10/2009
KR 10-0741874 B1 7/2007
KR 10-1401863 B1 5/2014

OTHER PUBLICATIONS

Office Action issued in corresponding Japanese Application No. 10-2018-0012040, dated Mar. 31, 2019.

*Primary Examiner* — Arun Ramaswamy
(74) *Attorney, Agent, or Firm* — Morgan, Lewis & Bockius LLP

(57) ABSTRACT

A capacitor component includes: a semiconductor substrate including first and second portions, a trench penetrating through the substrate from one surface of the substrate to the other surface of the substrate to separate the first and second portions of the substrate from each other, a dielectric layer disposed in the trench and on the one surface of the substrate; a first pad electrode and a second pad electrode spaced apart from each other, and penetrating through the dielectric layer to be in contact with the first and second portions of the substrate, respectively, and a passivation layer disposed on the dielectric layer, covering portions of the first pad electrode and the second pad electrode, and exposing at least a portion of each of the first pad electrode and the second pad electrode.

20 Claims, 7 Drawing Sheets

(51) Int. Cl.
*H01G 4/33* (2006.01)
*H01G 4/252* (2006.01)
*H01G 4/01* (2006.01)
*H01G 4/12* (2006.01)

(52) U.S. Cl.
CPC ........... *H01G 4/1209* (2013.01); *H01G 4/252* (2013.01); *H01G 4/33* (2013.01)

(58) Field of Classification Search
USPC .............................. 361/311, 306.1, 303, 304
See application file for complete search history.

(56) References Cited

U.S. PATENT DOCUMENTS

| | | | |
|---|---|---|---|
| 2009/0021888 A1* | 1/2009 | Jung | H01G 4/1227 361/303 |
| 2009/0046414 A1* | 2/2009 | Schmidt | B81C 1/0019 361/523 |
| 2009/0166701 A1* | 7/2009 | Doyle | H01L 27/10852 257/301 |
| 2009/0244808 A1 | 10/2009 | Ohtsuka et al. | |
| 2013/0250479 A1* | 9/2013 | Manohara | H01G 4/14 361/313 |
| 2014/0092524 A1* | 4/2014 | Kim | H01G 4/01 361/305 |

\* cited by examiner

CAPACITOR COMPONENT

CROSS-REFERENCE TO RELATED APPLICATION(S)

This application claims benefit of priority to Korean Patent Application No. 10-2018-0012040 filed on Jan. 31, 2018 in the Korean Intellectual Property Office, the disclosure of which is incorporated herein by reference in its entirety.

TECHNICAL FIELD

The present disclosure relates to a capacitor component.

BACKGROUND

As electronic devices become thinner, there is an increasing need for thinner capacitor components.

Also, as communication frequencies of electronic devices increase, there is an increasing need to enhance self resonant frequencies (SRFs) of capacitor components.

Since a multilayer ceramic capacitor (MLCC), a type of capacitor, has components including a plurality of internal electrode layers and a dielectric layer formed between adjacent internal electrode layers, there is a limitation in thinning the MLCC.

In addition, since capacitances formed between adjacent internal electrode layers are connected in parallel, and a distance between external electrodes is relatively long in the MLCC, there is a structural limitation in that it is difficult to enhance a resonant frequency.

SUMMARY

An aspect of the present disclosure may provide a capacitor component for matching of a high radio frequency (RF) that may have a high self resonant frequency (SRF) and a low capacitance and that may be separately manufactured to be mounted on a circuit board.

Also, another aspect of the present disclosure may provide a capacitor with a low equivalent series inductance (ESL) by minimizing an interval between pad electrodes and minimizing a current pass.

According to an aspect of the present disclosure, a capacitor component may include: a semiconductor substrate including first and second portions, a trench penetrating through the substrate from one surface of the substrate to the other surface of the substrate to separate the first and second portions of the substrate from each other, a dielectric layer disposed in the trench and on the one surface of the substrate, a first pad electrode and a second pad electrode spaced apart from each other, and penetrating through the dielectric layer to be in contact with the first and second portions of the substrate, respectively, and a passivation layer disposed on the dielectric layer, covering portions of the first pad electrode and the second pad electrode, and exposing at least a portion of each of the first pad electrode and the second pad electrode.

According to another aspect of the present disclosure, a capacitor component may include: a first internal electrode body and a second internal electrode body each made of a semiconductor, a dielectric layer including an embedding portion disposed between the first internal electrode body and the second internal electrode body and an extension portion extending on one surface of each of the first internal electrode body and the second internal electrode body, pad electrodes penetrating through the extension portion and connected to the first internal electrode body and the second internal electrode body, respectively, and a passivation layer penetrating through the pad electrodes to separate the pad electrodes.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
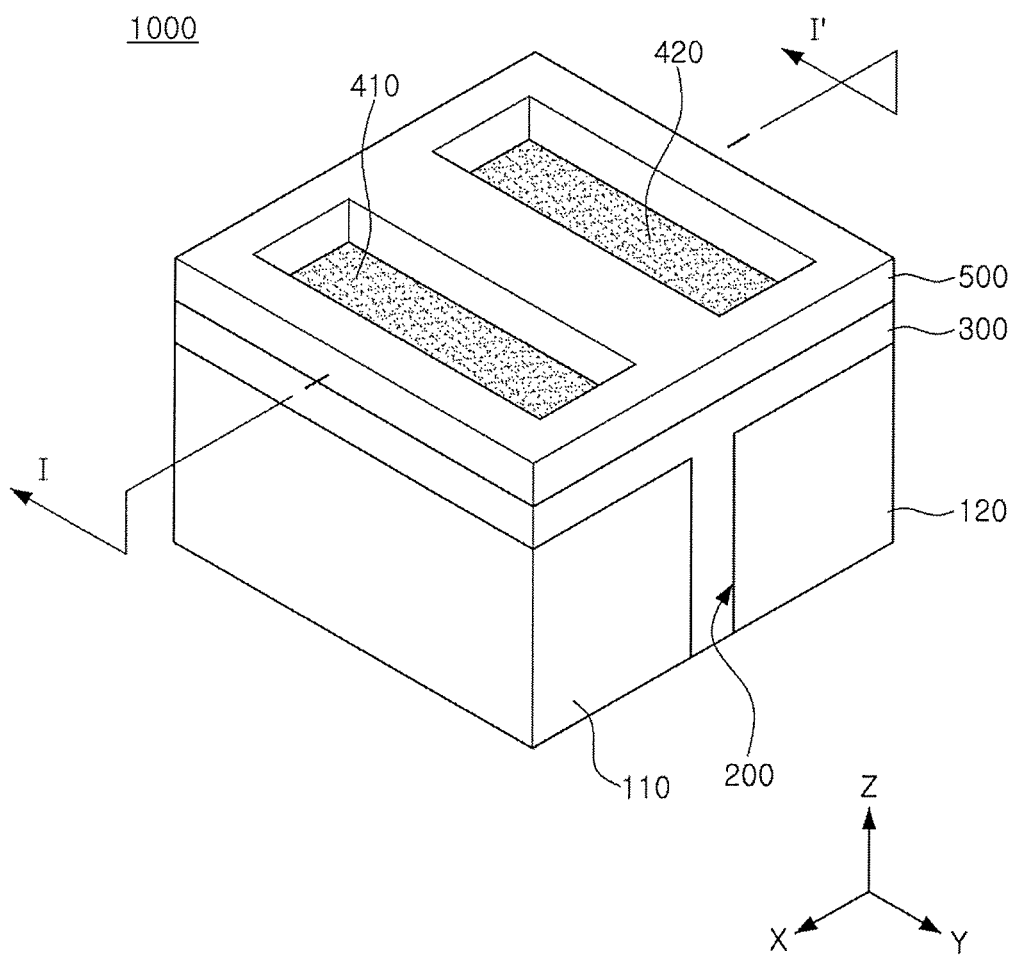
FIG. 1 is a view schematically illustrating a capacitor component according to an exemplary embodiment in the present disclosure.

Hereinafter, exemplary embodiments of the present disclosure will now be described in detail with reference to the accompanying drawings.

In the drawings, a first direction or a length direction may be defined as an X direction, a second direction or a width direction may be defined as a Y direction, and a third direction or a thickness direction may be defined as a Z direction.

Hereinafter, a capacitor component and a method of manufacturing the capacitor component according to exemplary embodiments in the present disclosure will be described in detail with reference to the accompanying drawings. In description with reference to the accompanying drawings, the same or corresponding elements are denoted by the same reference numerals, and a redundant description thereof will be omitted.

Capacitor Component

Figure 2:
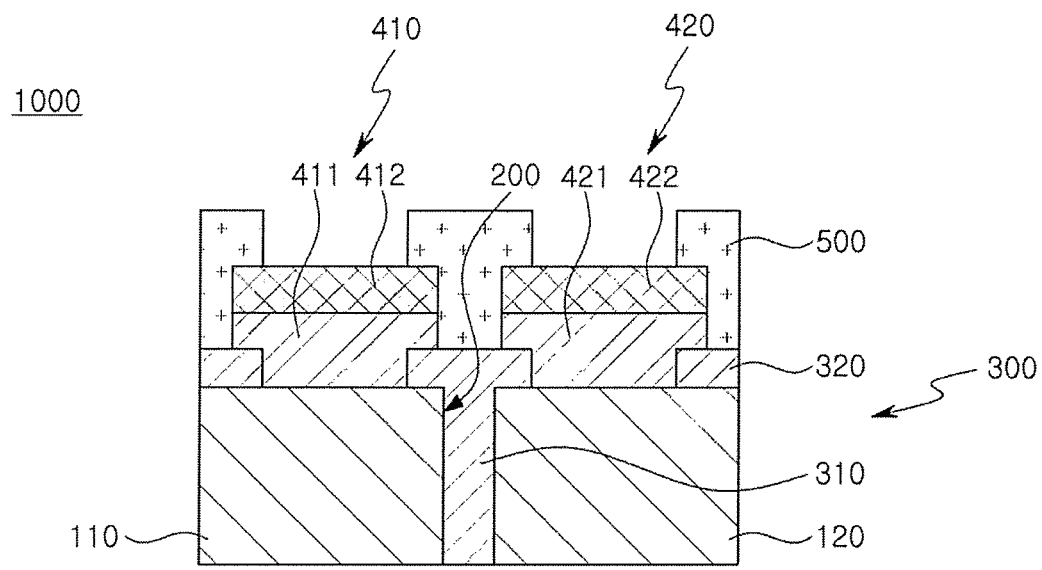
FIG. 2 is a cross-sectional view taken along line I-I' of FIG. 1.

FIG. 1 is a view schematically illustrating a capacitor component according to an exemplary embodiment in the present disclosure. FIG. 2 is a cross-sectional view taken along line I-I' of FIG. 1.

Referring to FIGS. 1 and 2, a capacitor component 1000 according to an exemplary embodiment in the present disclosure may include a first internal electrode body 110, a second internal electrode body 120, a trench 200, a dielectric layer 300, a first pad electrode 410, a second pad electrode 420, and a passivation layer 500.

A size and a shape of each of the first internal electrode body 110 and the second internal electrode body 120 are not particularly limited. As an example, each of the first internal electrode body 110 and the second internal electrode body 120 may have substantially a hexahedral shape, but exemplary embodiments are not limited thereto. In addition, as an example, a size of each of the first internal electrode body 110 and the second internal electrode body 120 may be set so that the capacitor component 1000 including the dielectric layer 300 and the passivation layer 500 according to the present exemplary embodiment may have a 0402 size of "0.4 mm*0.2 mm*0.2 mm" in length*width*thickness, but exemplary embodiments are not limited thereto.

Figure 4:
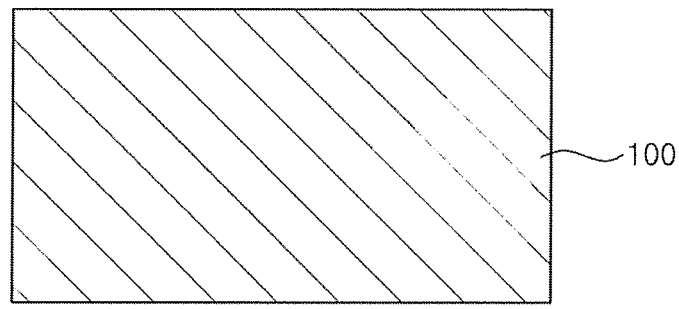
FIGS. 4 through 12 are views sequentially illustrating a manufacturing process of a capacitor component according to an exemplary embodiment in the present disclosure.

The first internal electrode body 110 and the second internal electrode body 120 may be formed as semiconductor substrates (for example, a semiconductor substrate 100 of FIG. 4). The first internal electrode body 110 and the second internal electrode body 120 may be formed by dividing a semiconductor substrate by a trench that will be described below.

The semiconductor substrate may be a single crystalline silicon wafer, or a polycrystalline silicon wafer, but is not limited thereto.

The semiconductor substrate may have a relatively low resistivity so that the first internal electrode body 110 and the second internal electrode body 120 of the capacitor component 1000 according to the present exemplary embodiment may be used as internal electrodes.

To this end, the semiconductor substrate may be an extrinsic semiconductor. As an example, the semiconductor substrate may be an N-type silicon wafer doped with a donor such as phosphor (P), but is not limited thereto.

As an example, a resistivity of the semiconductor substrate may be less than $10^{-3}$ Ω·cm. To this end, the semiconductor substrate may be doped with a donor such as phosphor (P), at a concentration of $10^{20}$ ions/cm$^3$, but exemplary embodiments are not limited thereto.

The trench 200 may penetrate through the substrate from one surface of the substrate to the other surface of the substrate, to divide the substrate. In other words, the trench 200 may divide the substrate to form the first internal electrode body 110 and the second internal electrode body 120.

Thus, the trench 200 may penetrate through the substrate in a thickness direction of the substrate, and penetrate through the substrate in a width direction of the substrate.

A depth (Z direction of FIG. 1) of the trench 200, a width (Y direction of FIG. 1) of the trench 200, and a length (X direction of FIG. 1) of the trench 200 may be designed in consideration of a required capacitance, a required package thickness, and the like, of a capacitor component.

Specifically, for example, when the depth of the trench 200 is set to 100 µm, the width of the trench 200 is set to 200 µm, the length of the trench 200 is set to 0.7 µm, and the trench 200 is formed of silicon dioxide ($SiO_2$) with a relative permittivity of 3.9, a capacitor component having a capacity of 1 pF may be obtained.

The dielectric layer 300 may be formed on one surface of the first internal electrode body 110, one surface of the second internal electrode body 120, and the trench 200.

The dielectric layer 300 may include silicon dioxide (SiO2). When a semiconductor substrate includes silicon (Si), the dielectric layer 300 may be formed by performing a thermal oxidation process on the semiconductor substrate on which a trench is formed.

The dielectric layer 300 may include an embedding portion 310 formed in the trench 200 between the first internal electrode body 110 and the second internal electrode body 120, and an extension portion 320 formed on one surface of each of the first internal electrode body 110 and the second internal electrode body 120.

When the dielectric layer 300 is formed by a thermal oxidation process, the embedding portion 310 and the extension portion 320 may be integrally formed. The integrally forming of the embedding portion 310 and the extension portion 320 may indicate that the embedding portion 310 and the extension portion 320 are not distinguished from each other since an interface between the embedding portion 310 and the extension portion 320 is not formed.

The first pad electrode 410 and the second pad electrode 420 may each penetrate through the extension portion 320 of the dielectric layer 300 to be in contact with one surface of each of the first internal electrode body 110 and the second internal electrode body 120, and may be spaced apart from each other. In other words, the first pad electrode 410 may penetrate through the extension portion 320 and may be connected to the first internal electrode body 110, and the second pad electrode 420 may penetrate through the extension portion 320 and may be connected to the second internal electrode body 120.

Figure 8:
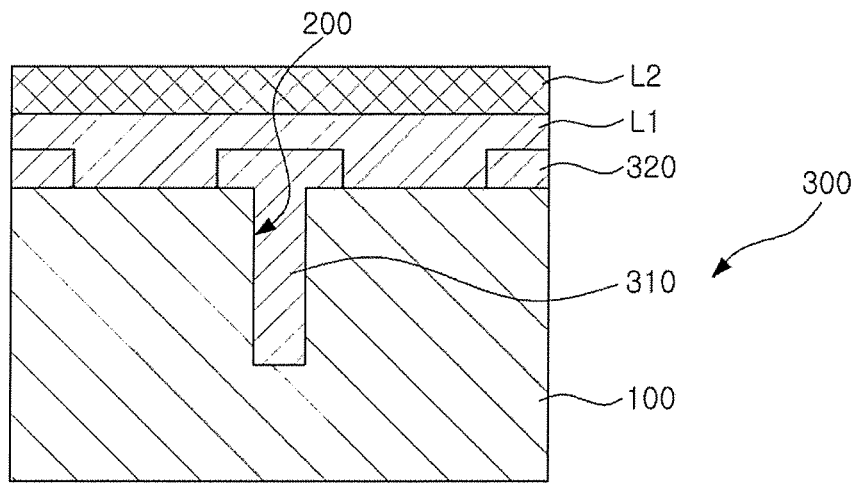

Each of the first pad electrode 410 and the second pad electrode 420 may be formed by forming metal films for forming a pad electrode (for example, metal layers L1 and L2 for forming a pad electrode of FIG. 8) on one entire surface of each of the first internal electrode body 110 and the second internal electrode body 120, and by selectively removing the metal films. In other words, the first pad electrode 410 and the second pad electrode 420 may be formed by separating the metal films. The passivation layer 500 that will be described below may be formed between the first pad electrode 410 and the second pad electrode 420 that are separated from each other. In this regard, the pad electrodes 410 and 420 may be expressed as separated by the passivation layer 500.

The first pad electrode 410 and the second pad electrode 420 may be formed of conductive metals. The conductive metals may include, for example, one of aluminum (Al), silver (Ag), lead (Pb), platinum (Pt), nickel (Ni), gold (Au), copper (Cu), alloys thereof, and the like, but are not limited thereto.

Each of the first pad electrode 410 and the second pad electrode 420 may include first layers 411 and 421 each disposed on one surface of each of the internal electrode bodies 110 and 120 and including aluminum, and second layers 412 and 422 disposed on the first layers 411 and 421 and including nickel (Ni). In other words, each of the first pad electrode 410 and the second pad electrode 420 may be formed with a double-layer structure with different metals.

The first layers 411 and 421 including aluminum (Al) may reduce a total resistivity of the pad electrodes 410 and 420, and the second layers 412 and 422 including nickel (Ni) may enhance a bonding strength between the pad electrodes 410 and 420 and a solder.

Each of the first pad electrode 410 and the second pad electrode 420 may extend onto the dielectric layer 300. In other words, referring to FIG. 2, as an example, the first pad electrode 410 may be extended to an upper surface of the extension portion 320 of the dielectric layer 300. In addition, when the pad electrodes 410 and 420 are formed with double-layer structures including the first layers 411 and 421 and the second layers 412 and 422, the first layers 411 and 421 or the second layers 412 and 422 may extend onto the extension portion 320.

Since the first pad electrode 410 and the second pad electrode 420 extend onto the dielectric layer 300, a distance between the pad electrodes 410 and 420 may be reduced.

The passivation layer 500 may be formed on the dielectric layer 300, may cover portions of the first pad electrode 410 and the second pad electrode 420, and may expose at least a portion of each of the first pad electrode 410 and the second pad electrode 420.

Electric charges of different polarities may be applied to the first pad electrode 410 and the second pad electrode 420 each having at least a portion exposed by the passivation layer 500.

The passivation layer 500 may protect the first internal electrode body 110, the second internal electrode body 120, the first pad electrode 410 and the second pad electrode 420 from external impact or moisture.

The passivation layer 500 may include a polymer. As an example, the passivation layer 500 may include benzocyclobutene (BCD), polyimide, and the like, but is not limited thereto.

Figure 3:
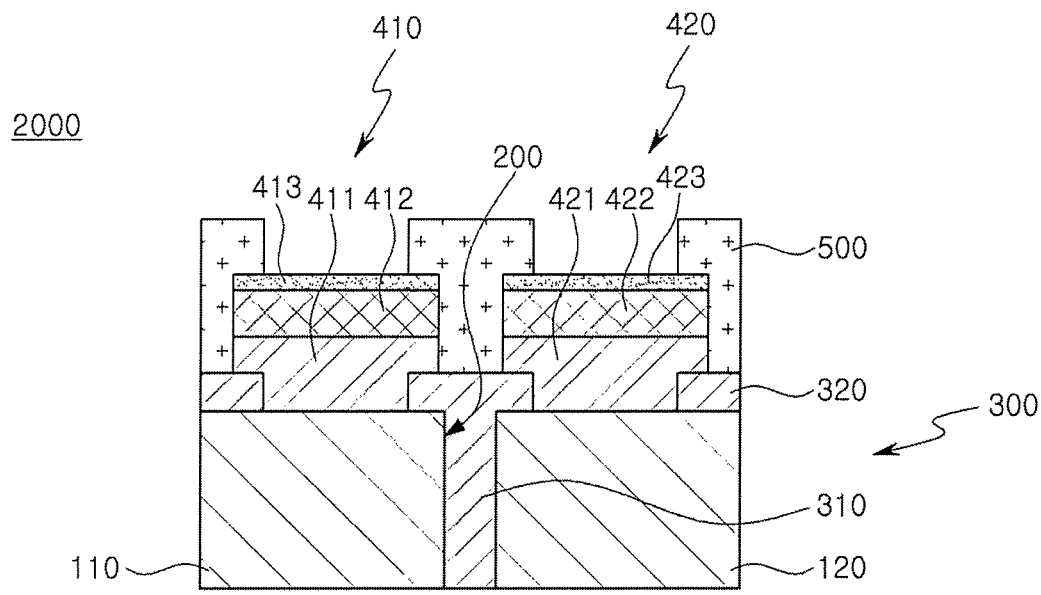
FIG. 3 is a cross-sectional view schematically illustrating a capacitor component according to another exemplary embodiment in the present disclosure.

FIG. 3 is a cross-sectional view schematically illustrating a capacitor component according to another exemplary embodiment in the present disclosure.

A capacitor component 2000 according to another exemplary embodiment may include the same elements as those of the capacitor component 1000 according to an exemplary embodiment except a structure of a first pad electrode 410 and a second pad electrode 420.

Thus, in the following description of the present exemplary embodiment, only the first pad electrode 410 and the second pad electrode 420 different from those of the capacitor component 1000 according to an exemplary embodiment will be described.

The first pad electrode 410 and the second pad electrode 420 may be disposed on the first internal electrode body 110 and the second internal electrode body 120, respectively, and may further include third layers 413 and 423 including gold (Au).

In the present exemplary embodiment, the third layers 413 and 423 including gold (Au) may be additionally formed on the second layers 412 and 422 including nickel (Ni), and thus it is possible to prevent an oxidation of the second layers 412 and 422.

Meanwhile, in the present exemplary embodiment, the third layers 413 and 423 including gold (Au) have been described, however, the third layers 413 and 423 may also include silver (Ag).

The capacitor components 1000 and 2000 having the above-described structure according to the exemplary embodiments in the present disclosure may have a high self resonant frequency (SRF) and a low capacitance, and may be manufactured separately from a circuit substrate and mounted in the circuit substrate.

In addition, an interval between the first and second pad electrodes 410 and 420 may be minimized, and thus it is possible to minimize a current pass. Thus, the capacitor components 1000 and 2000 according to the exemplary embodiments in the present disclosure may lower an equivalent series inductance (ESL) and an equivalent series resistance (ESR).

Method of Manufacturing Capacitor Component

FIGS. 4 through 12 are views sequentially illustrating manufacturing processes of a capacitor component according to an exemplary embodiment in the present disclosure.

First, referring to FIG. 4, a semiconductor substrate 100 may be prepared.

The semiconductor substrate 100 may be a single crystalline silicon wafer, or a polycrystalline silicon wafer, but is not limited thereto.

Through processes that will be described below, the semiconductor substrate 100 may be formed to be a first internal electrode body 110 and a second internal electrode body 120. The first internal electrode body 110 and the second internal electrode body 120 may correspond to internal electrodes of a typical capacitor component. Thus, the semiconductor substrate 100 may have a relatively low resistivity.

The semiconductor substrate 100 may be an extrinsic semiconductor. As an example, the semiconductor substrate 100 may be an N-type silicon wafer doped with a donor such as phosphor (P), but is not limited thereto.

It is desirable that the semiconductor substrate 100 may have a relatively low resistivity. For example, a resistivity of the semiconductor substrate 100 may be less than $10^{-3}$ $\Omega \cdot cm$. Accordingly, the semiconductor substrate 100 may be a silicon wafer doped with a donor, such as phosphor (P), at a concentration of $10^{20}$ ions/cm$^3$.

Meanwhile, when the resistivity of the semiconductor substrate 100 is higher than the above-described resistivity, an ion implantation and diffusion process may be performed after a trench formation process that will be described below. In this case, an ion concentration of each of an inner wall of the trench and one surface of the semiconductor substrate 100 may become higher than an ion centration of the other regions of the semiconductor substrate 100. In other words, even though a total resistivity of the semiconductor substrate 100 is relatively high, a resistivity of each of the inner walls of the trench and one surface of the semiconductor substrate 100, which is a current path, may be relatively reduced.

When a semiconductor substrate applied to the present exemplary embodiment is at a level that enables partitioning into a plurality of unit regions, like a wafer, processes that will be described below may be collectively performed on the plurality of unit regions at a wafer level, but exemplary embodiments are not limited thereto.

Figure 5:
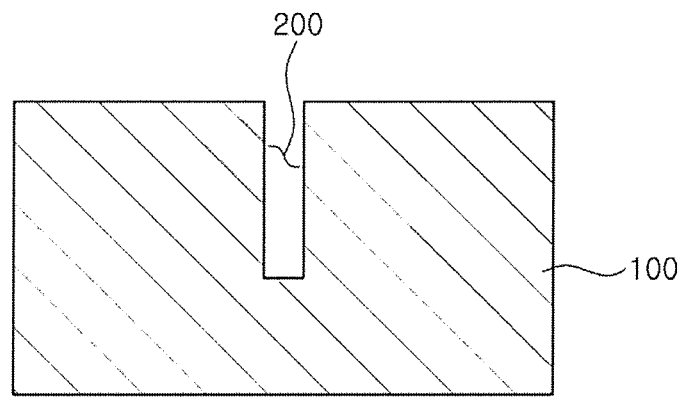

Next, referring to FIG. 5, a non-through trench may be formed on the substrate.

A trench 200 may be formed by etching one surface of the substrate 100, but exemplary embodiments are not limited thereto.

A thickness of the trench 200, a width of the trench 200, and a length of the trench 200 may be designed in consideration of a required capacitance, a required package thickness, and the like.

In this process, the trench 200 may be formed not to penetrate through the substrate 100 in a thickness direction of the substrate 100.

Figure 6:
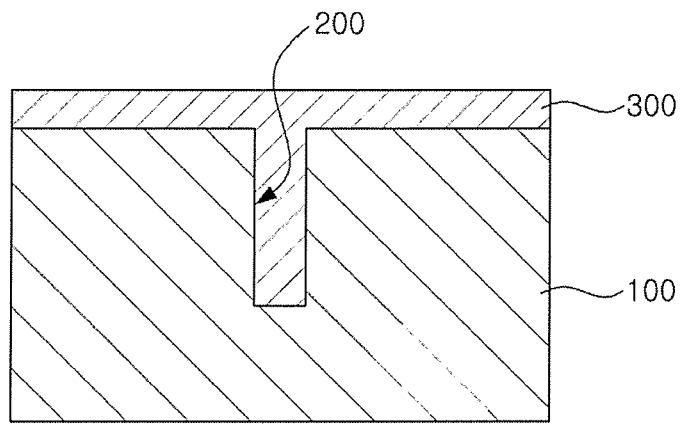

Next, referring to FIG. 6, a dielectric layer 300 may be formed.

The dielectric layer 300 may be formed by a sputtering process, a vapor deposition process, or a thermal oxidation process.

When the semiconductor substrate 100 is a silicon wafer, the dielectric layer 300 may be formed on a surface of the semiconductor substrate 100 including an inner wall of the trench 200 by the thermal oxidation process on the silicon wafer.

When the dielectric layer 300 is formed by a thermal oxidation process, a dimension (X direction) of the trench 200 after the thermal oxidation process may become greater than the dimension of the trench 200 before the thermal oxidation process.

Figure 7:
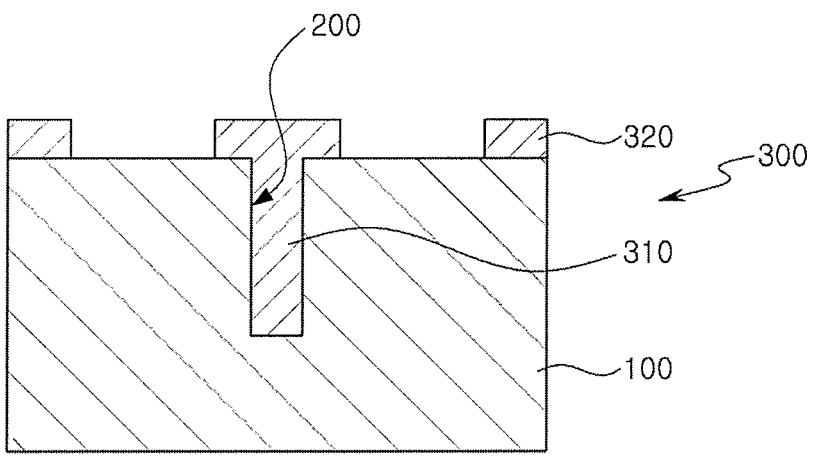

Next, referring to FIG. 7, at least a portion of one surface of the substrate 100 may be exposed by selectively removing the dielectric layer 300.

This process may include a process of applying a photosensitive material onto one surface of the dielectric layer 300, a process of forming an etching mask having an opening formed through a photolithography process, and a process of selectively etching the dielectric layer 300 exposed by the opening of the etching mask, but exemplary embodiments are not limited thereto.

The photosensitive material may be formed by laminating a material in a form of a film, such as a dry film, and the like, or may be formed by applying a liquid photoresist by spin coating.

Next, referring to FIG. 8, metal films L1 and L2 for forming pad electrodes may be formed on one surface of the dielectric layer 300 and one surface of the substrate 100 that is exposed.

The metal films L1 and L2 may be separated as the first pad electrode 410 and the second pad electrode 420 according to the present exemplary embodiment through a process that will be described below.

A process of forming the metal films L1 and L2 may include a process of forming a metal film L1 for forming a first layer, and a process of forming a metal film L2 for forming a second layer.

The metal films L1 and L2 may be formed by an atomic layer deposition (ALD) process, but is not limited thereto. For example, the metal films L1 and L2 may be formed by a PVD, a CVD, sputtering, electroless plating, or electroplating.

Figure 9:
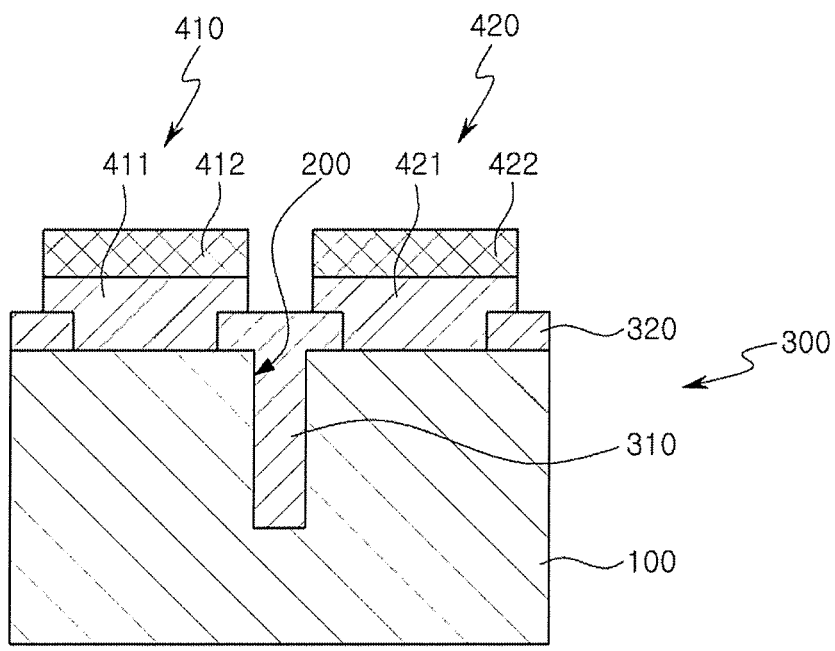

Next, referring to FIG. 9, the metal films L1 and L2 may be separated.

By separating the metal films L1 and L2, the first pad electrode 410 and the second pad electrode 420 according to the present exemplary embodiment may be formed.

This process may include a process of applying a photosensitive material onto one surface of each of the metal films L1 and L2, a process of forming an etching mask having an opening formed through a photolithography process, and a process of selectively etching the metal films L1 and L2 exposed by the opening of the etching mask, but exemplary embodiments are not limited thereto.

The photosensitive material may be formed by laminating a material in a form of a film, such as a dry film, and the like, or may be formed by applying a liquid photoresist by spin coating.

Figure 10:
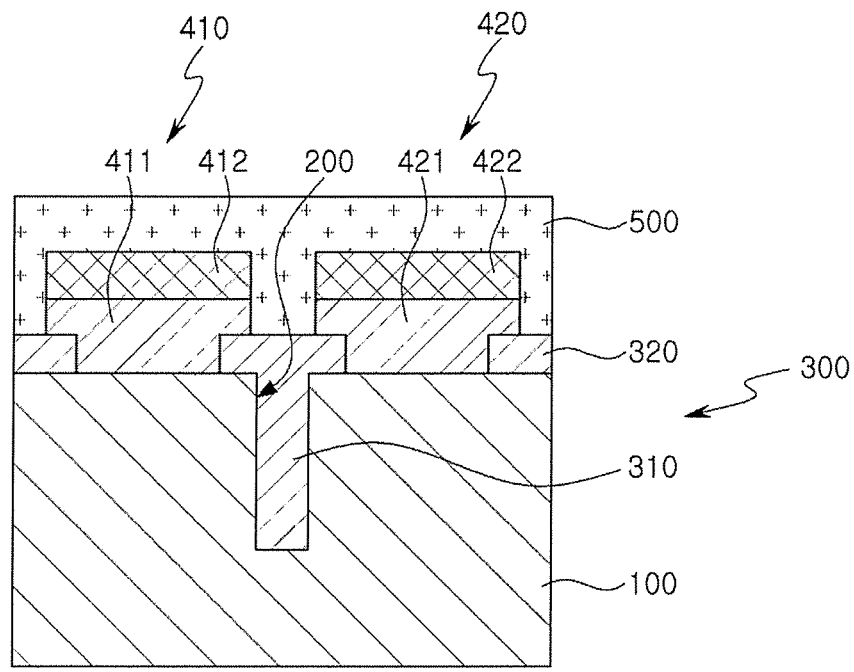
Figure 11:
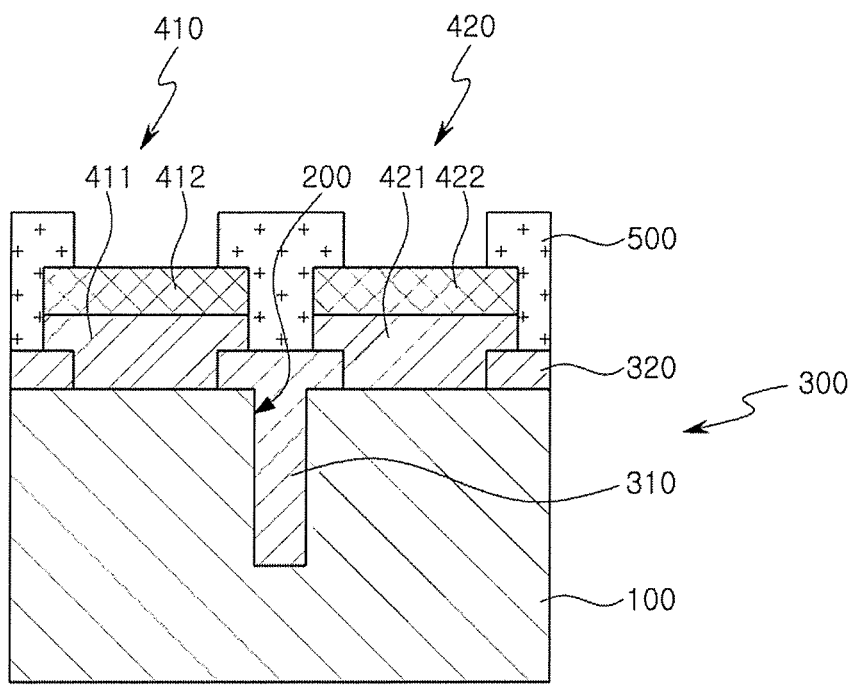

Next, referring to FIGS. 10 and 11, a passivation layer 500 may be formed.

The passivation layer 500 may be formed by laminating a material in a form of a film, or may be formed by a vapor deposition method, a sputtering method, and the like.

The passivation layer 500 may expose at least a portion of each of the first of pad electrode 410 and the second pad electrode 420. Accordingly, the passivation layer 500 may be formed to cover all surfaces of the first pad electrode 410 and the second pad electrode 420, and may be selectively removed so that at least a portion of one surface of each of the first pad electrode 410 and the second pad electrode 420 may be exposed.

When the passivation layer 500 includes a photosensitive material, a process of selectively removing the passivation layer 500 may be performed by performing a photolithography process on the passivation layer 500 itself instead of using a separate photosensitive material. Alternatively, when the passivation layer 500 does not include a photosensitive material, the process of selectively removing the passivation layer 500 may include a process of applying a photosensitive material onto the passivation layer 500, a process of forming an etching mask having an opening formed through a photolithography process, and a process of selectively etching the passivation layer 500 exposed by the opening of the etching mask.

The photosensitive material may be formed by laminating a material in a form of a film, such as a dry film, and the like, or may be formed by applying a liquid photoresist by spin coating.

Figure 12:
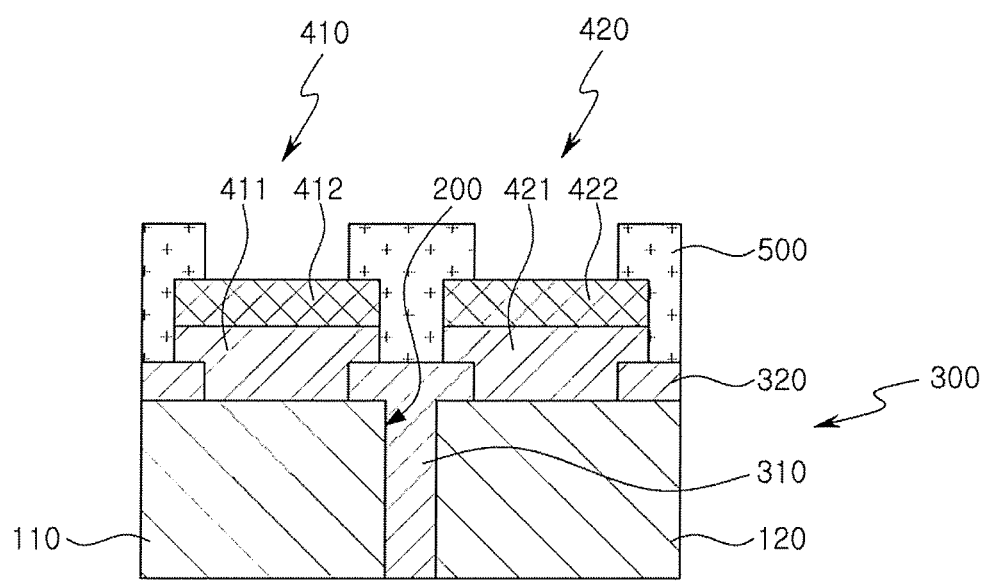

Next, referring to FIG. 12, a portion of the substrate 100 may be removed so that a bottom surface of the trench 200 may be exposed.

A process of removing a portion of the substrate 100 so that the bottom surface of the trench 200 is exposed may be performed by polishing the other surface of the substrate 100 opposing the one surface of the substrate 100. Here, the polishing may be a chemical mechanical polishing, but is not limited thereto.

The bottom surface of the trench 200 may be exposed, and accordingly the substrate 100 may be divided into the first internal electrode body 110 and the second internal electrode body 120.

When the semiconductor substrate 100 is at a wafer level, an individualization process may be performed after the above-described processes.

As set forth above, according to the exemplary embodiments in the present disclosure, a capacitor with a high SRF and a low capacitance may be provided, and a capacitor for matching of a high radio frequency (RF) that may be manufactured separately from a circuit substrate and mounted in the circuit substrate may be provided.

In addition, a capacitor that has a low ESL and a low ESR by minimizing an interval between pad electrodes and minimizing a current pass may be provided.

While exemplary embodiments have been shown and described above, it will be apparent to those skilled in the art that modifications and variations could be made without departing from the scope of the present invention as defined by the appended claim. For example, the abovementioned exemplary embodiments may be partially combined with each other.

What is claimed is:

1. A capacitor component comprising:
   a semiconductor substrate including first and second portions as first and second internal electrodes of the capacitor component, respectively;
   a trench penetrating through the semiconductor substrate from one surface of the semiconductor substrate to the other surface of the semiconductor substrate to separate the first and second portions of the semiconductor substrate from each other;
   a dielectric layer disposed in the trench to be in contact with a semiconductor material included in the first and second portions, and disposed on the one surface of the semiconductor substrate;
   a first pad electrode and a second pad electrode spaced apart from each other, and extending through portions of the dielectric layer on the one surface to be in contact with the first and second portions of the semiconductor substrate, respectively; and
   a passivation layer disposed on the dielectric layer, covering portions of the first pad electrode and the second pad electrode, and exposing at least a portion of each of the first pad electrode and the second pad electrode,
   wherein the first pad electrode and the second pad electrode are disposed on the one surface of the semiconductor substrate.

2. The capacitor component of claim 1, wherein the semiconductor substrate includes silicon (Si) and a donor.

3. The capacitor component of claim 2, wherein a concentration of the donor doped the semiconductor substrate is less than or equal to $10^{20}$ ions/cm$^3$.

4. The capacitor component of claim 1, wherein the dielectric layer includes silicon dioxide ($SiO_2$).

5. The capacitor component of claim 1, wherein each of the first pad electrode and the second pad electrode includes a first layer disposed on the one surface of the semiconductor substrate and including aluminum (Al), and a second layer disposed on the first layer and including nickel (Ni).

6. The capacitor component of claim 5, wherein at least one of the first layer and the second layer extends onto the dielectric layer.

7. The capacitor component of claim 5, wherein each of the first pad electrode and the second pad electrode further includes a third layer disposed on the second layer and including gold (Au).

8. The capacitor component of claim 1, wherein the passivation layer includes a polymer.

9. A capacitor component comprising: a semiconductor substrate including a first internal electrode body and a second internal electrode body as first and second internal electrodes of the capacitor component, respectively;
a dielectric layer including an embedding portion disposed between the first internal electrode body and the second internal electrode body to be in contact with a semiconductor material included in the first and second internal electrode bodies, and an extension portion extending from the embedding portion onto one surface of the semiconductor substrate;
pad electrodes extending through portions of the extension portion and connected to the first internal electrode body and the second internal electrode body, respectively; and
a passivation layer penetrating through the pad electrodes to separate the pad electrodes, wherein the pad electrodes are disposed on the one surface of the semiconductor substrate.

10. The capacitor component of claim 9, wherein the semiconductor is an extrinsic semiconductor.

11. The capacitor component of claim 9, wherein each of the first internal electrode body and the second internal electrode body is made of an extrinsic semiconductor doped with a donor.

12. The capacitor component of claim 9, wherein the embedding portion and the extension portion are integrally formed.

13. The capacitor component of claim 9, wherein each of the first internal electrode body, the second internal electrode body, and the dielectric layer includes silicon (Si).

14. The capacitor component of claim 9, wherein the passivation layer covers portions of the pad electrodes and exposes at least a portion of one surface of each of the pad electrodes.

15. The capacitor component of claim 9, wherein a resistivity of the semiconductor substrate is less than $10^{-3}$ $\Omega\cdot cm$, and
the pad electrodes are in direct contact with the first internal electrode body and the second internal electrode body, respectively.

16. The capacitor component of claim 1, wherein a resistivity of the semiconductor substrate is less than $10^{-3}$ $\Omega\cdot cm$, and
the first pad electrode and the second pad electrode are in direct contact with the first and second portions of the semiconductor substrate, respectively.

17. The capacitor component of claim 1, wherein the first pad electrode and the second pad electrode are spaced apart from the trench.

18. A capacitor component comprising:
a semiconductor substrate including first and second portions as first and second internal electrodes of the capacitor component, respectively;
a trench penetrating through the semiconductor substrate from one surface of the semiconductor substrate to the other surface of the semiconductor substrate to separate the first and second portions of the semiconductor substrate from each other;
a dielectric layer disposed in the trench to be in contact with a semiconductor material included in the first and second portions; and
a first pad electrode and a second pad electrode disposed on the semiconductor substrate and spaced apart from each other,
wherein, among the first and second portions of the semiconductor substrate, the first pad electrode is in direct contact with only the first portion and the second pad electrode is in direct contact with only the second portion.

19. The capacitor component of claim 18, wherein a resistivity of the semiconductor substrate is less than $10^{-3}$ $\Omega\cdot cm$.

20. The capacitor component of claim 18, wherein the semiconductor substrate includes silicon (Si) and a donor, and
a concentration of the donor doped the semiconductor substrate is less than or equal to $10^{20}$ ions/cm$^3$.

* * * * *